United States Patent
Lee et al.

(10) Patent No.: US 10,119,811 B2
(45) Date of Patent: Nov. 6, 2018

(54) ALIGNMENT MARK, METHOD OF MEASURING WAFER ALIGNMENT, AND METHOD OF MANUFACTURING A SEMICONDUCTOR DEVICE USING THE METHOD OF MEASURING WAFER ALIGNMENT

(71) Applicant: Samsung Electronics Co., Ltd., Suwon-si (KR)

(72) Inventors: Seung Yoon Lee, Suwon-si (KR); Chan Hwang, Seoul (KR); Jeong Jin Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/448,325

(22) Filed: Mar. 2, 2017

(65) Prior Publication Data
US 2017/0261317 A1  Sep. 14, 2017

(30) Foreign Application Priority Data
Mar. 14, 2016  (KR) .......... 10-2016-0030311

(51) Int. Cl.
| | |
|---|---|
| *G01B 11/14* | (2006.01) |
| *G01B 11/27* | (2006.01) |
| *G01B 11/00* | (2006.01) |
| *G03F 9/00* | (2006.01) |

(52) U.S. Cl.
CPC .......... *G01B 11/272* (2013.01); *G01B 11/002* (2013.01); *G03F 9/7084* (2013.01); *H01L 2224/16145* (2013.01)

(58) Field of Classification Search
CPC .... G03F 9/7046; G03F 9/7003; G03F 9/7015; G03F 9/7084; G03F 9/7049; G01B 11/272; G01B 11/002
USPC .......................................... 356/399–401, 620
See application file for complete search history.

(56) References Cited

U.S. PATENT DOCUMENTS

| | | | | |
|---|---|---|---|---|
| 5,808,742 | A | * | 9/1998 | Everett ..................... G03F 9/70 356/401 |
| 6,486,954 | B1 | | 11/2002 | Mieher et al. |
| 6,888,261 | B2 | | 5/2005 | Song et al. |
| 6,982,793 | B1 | * | 1/2006 | Yang ................... G03F 7/70633 356/401 |
| 7,084,987 | B2 | | 8/2006 | Kreuzer |
| 8,592,287 | B2 | | 11/2013 | Shih et al. |

(Continued)

FOREIGN PATENT DOCUMENTS

| | | |
|---|---|---|
| JP | 2001-052991 | 2/2001 |
| JP | 2011-232549 | 11/2011 |

(Continued)

*Primary Examiner* — Isiaka Akanbi
(74) *Attorney, Agent, or Firm* — Muir Patent Law, PLLC (57) ABSTRACT

A method for measuring wafer alignment is provided. The method includes providing a plurality of first mark patterns extending in a first direction on a wafer, providing at least one second mark pattern on the first mark patterns such that it overlaps and intersects the first mark patterns, irradiating an optical signal onto the first mark patterns and the second mark pattern and obtaining coordinates of the second mark pattern by detecting signals from the second mark pattern.

6 Claims, 11 Drawing Sheets

(56) References Cited

U.S. PATENT DOCUMENTS

| | | | |
|---|---|---|---|
| 2007/0020537 A1* | 1/2007 | Harakawa | G03F 7/70458 430/30 |
| 2009/0225331 A1* | 9/2009 | Van Haren | G03F 7/70633 356/614 |
| 2009/0257045 A1* | 10/2009 | Tokuyama | G01B 11/002 355/77 |
| 2009/0269685 A1* | 10/2009 | Yanagawa | G01B 11/002 430/30 |
| 2015/0116686 A1 | 4/2015 | Lee et al. | |

FOREIGN PATENT DOCUMENTS

| | | |
|---|---|---|
| JP | 2014-160749 | 9/2014 |
| KR | 0492779 | 6/2005 |
| KR | 2008-0005717 | 1/2008 |

* cited by examiner

| m1 ↗ | m2 ↗ | m3 → | m4 ↘ |
|---|---|---|---|
| d1(0.2,0.2) | d2(0.3,0.15) | d3(0.35,0.1) | d4(0.35,-0.15) |
| m5 ↑ | m6 • | m7 ↙ | m8 ↓ |
| d5(0.1,0.4) | d6(0.0,0.0) | d7(-0.2,-0.3) | d8(0.3,-0.45) |
| m9 ↑ | m10 ↖ | m11 ↙ | m12 ↙ |
| d9(-0.2,0.3) | d10(-0.25,0.2) | d11(-0.25,-0.15) | d12(-0.35,-0.45) |
| m13 ↖ | m14 ← | m15 ↙ | m16 ↙ |
| d13(-0.3,0.2) | d14(-0.3,0.1) | d15(-0.4,-0.45) | d16(-0.5,-0.5) |

ALIGNMENT MARK, METHOD OF MEASURING WAFER ALIGNMENT, AND METHOD OF MANUFACTURING A SEMICONDUCTOR DEVICE USING THE METHOD OF MEASURING WAFER ALIGNMENT

This application claims priority to Korean Patent Application No. 10-2016-0030311 filed on Mar. 14, 2016 with the Korean Intellectual Property Office, the disclosure of which is incorporated herein by reference in its entirety.

BACKGROUND

1. Field of the Disclosure

The present disclosure relates to wafer alignment marks, methods of measuring wafer alignment using the alignment marks, and methods of manufacturing semiconductor devices using the methods of measuring wafer alignment.

2. Description of the Related Art

Typically, a circuit pattern is formed on a wafer by performing a photolithography process. When a photolithography process is performed, a wafer is exposed to light by using a mask having a patterned surface.

Such an exposure process may be performed on a plurality of layers. As processes becomes finer and more complicated, the plurality of layers may be aligned with a wafer and/or with a pattern/mark on the wafer before performing an exposure process.

SUMMARY

Aspects of the present disclosure provide wafer alignment marks used for aligning a plurality of layers on a semiconductor wafer.

Aspects of the present disclosure also provide a method for measuring errors of wafer alignment marks that may be used for aligning a plurality of layers on a semiconductor wafer.

This and other aspects, embodiments and advantages of the present disclosure will become immediately apparent to those of ordinary skill in the art upon review of the Detailed Description and Claims to follow.

In one aspect of the present disclosure, a method of measuring wafer alignment includes providing a first mark pattern extending in a first direction on a wafer, providing a second mark pattern on the first mark pattern overlapping the first mark pattern, irradiating an optical signal onto the first mark patterns and the second mark pattern and obtaining coordinates of the second mark pattern by detecting signals from the second mark pattern.

In another aspect of the present disclosure, a method of measuring wafer alignment includes providing a first mark pattern on a wafer, the first mark pattern comprising a plurality of first line patterns, the first line patterns extending in a first direction and spaced apart from one another, providing a second mark pattern on the first mark pattern, the second mark pattern comprising a plurality of rows of discrete patterns, the discrete patterns arranged in a second direction that is an oblique direction with respect to the first direction, irradiating an optical signal onto the first mark patterns and the second mark patterns, obtaining coordinates of the second mark pattern by detecting signals from the second mark pattern and calculating a deviation of the first mark pattern from a reference position in a third direction perpendicular to the first mark patterns and calculating a deviation of the first mark pattern from a reference position in a third direction perpendicular to the first line patterns and a deviation of the second mark pattern from the reference position in the first direction using the coordinates of the second mark pattern.

In certain aspect of the present disclosure, a method includes providing a first mark pattern on a substrate, the first mark pattern comprising a plurality of first line patterns, each of the first line patterns extending in a first direction and spaced apart from the other first lien patterns in a second direction perpendicular to the first direction, providing a second mark pattern comprising a plurality of rows of discrete patterns, each of the discrete patterns overlapping a portion of the plurality of first line patterns, irradiating light on the second mark pattern, and measuring a position of the second mark pattern by examining reflected light of the irradiated light on the second mark pattern, wherein the discrete patterns of the second mark pattern are arranged in an inclined direction with respect to the first direction.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present. Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Figure 1A:
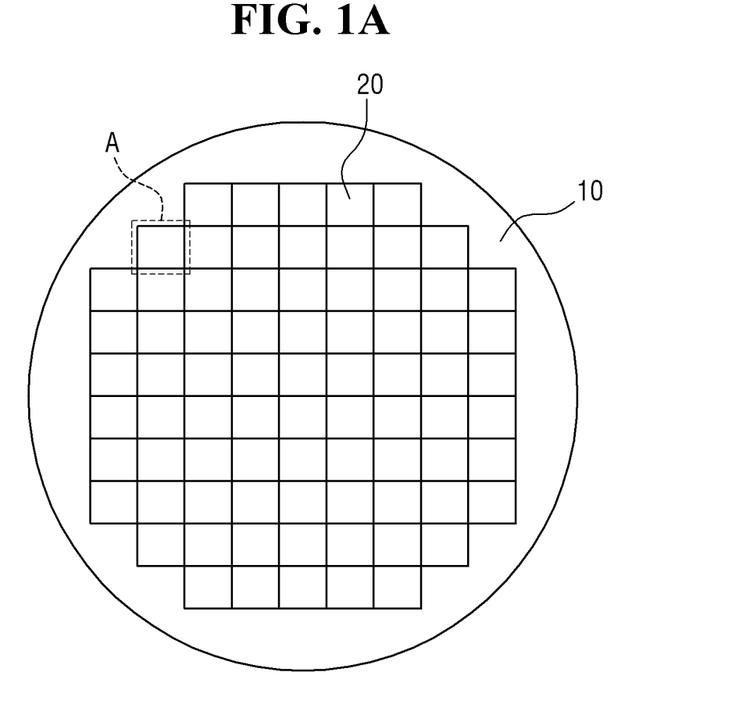
FIG. 1A is a plan view of a wafer on which wafer alignment marks are formed.
Figure 1B:
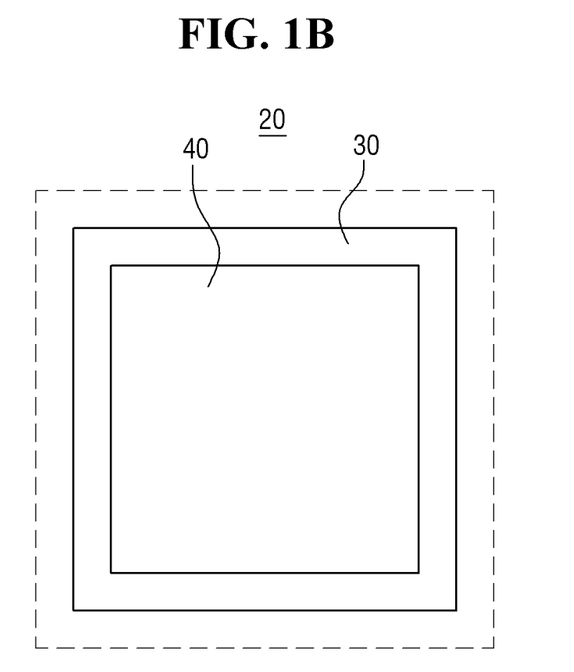
FIG. 1B is an enlarged view of portion A of FIG. 1A.

FIG. 1A is a plan view of a wafer on which wafer alignment marks are formed. FIG. 1B is an enlarged view of portion A of FIG. 1A.

Referring to FIGS. 1A and 1B, wafer alignment marks according to an exemplary embodiment of the present disclosure may be formed on a semiconductor wafer 10.

A plurality of semiconductor chips 20 may be formed on the semiconductor wafer 10. Each of the semiconductor chips 20 may include a circuit area 40 and a scribe area 30. The circuit area 40 refers to a portion of the wafer in which a semiconductor circuit is formed. The plurality of semiconductor chips 20 formed on the wafer may be separated from one another by a scribe process for packaging in a later process. The scribe area 30 may include a non-circuit area formed between the circuit area 40 and an edge of a chip 20.

In the scribe area 30, a scribe process may be performed for dicing adjacent semiconductor chips 20 to separate each semiconductor chip from the wafer and each other. The scribe area 30 may include an area that can be subject to cutting (during this singulation process) and its removal will not affect the proper operation of the semiconductor chips 20.

The semiconductor chips 20 may include, for example, memory chips, logic chips, etc. In the case that the semiconductor chips 20 are memory chips or logic chips, the semiconductor chips 20 may be designed in a variety of ways based on operations they perform. If the semiconductor chips 20 are memory chips, the memory chips may be non-volatile memory chips, for example. The memory chips may be flash memory chips. For example, the memory chips may be either NAND flash memory chips or NOR flash memory chips.

In some embodiments of the present disclosure, the memory chips may be volatile memory chips. The memory chips may be dynamic random access memories (DRAMs), static random access memories (SRAMs), embedded RAMs, for example.

If the semiconductor chips 20 are logic chips, the logic chips may include, for example, central processing units (CPUs) and graphics processing units (GPUs).

Although examples of the semiconductor chips 20 have been mentioned above, the types of the semiconductor chips 20 according to exemplary embodiment of the present disclosure are not limited thereto.

The wafer alignment marks according to the exemplary embodiment of the present disclosure may be formed in the scribe areas 30 on the semiconductor wafer 10.

Figure 2:
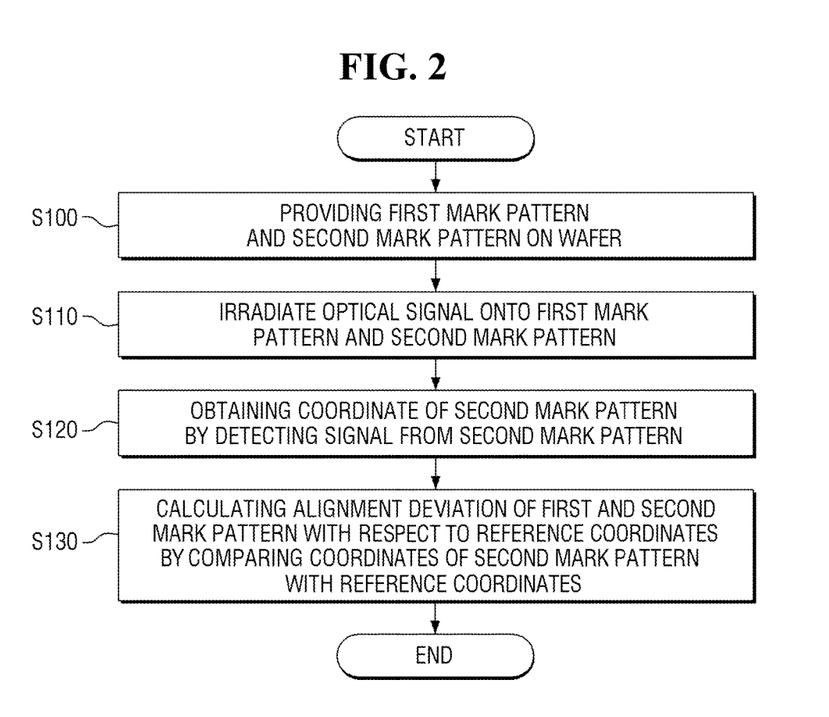
FIG. 2 is a flowchart illustrating a method for measuring alignment deviations of wafer alignment marks according to an embodiment of the present disclosure.

FIG. 2 is a flowchart illustrating a method of measuring alignment deviations of wafer alignment marks according to an embodiment of the present disclosure. The method of measuring alignment deviations may include determining whether the alignment deviation is within an acceptable variation or not (e.g., error).

Referring to FIG. 2, the method includes providing first and second mark patterns on a wafer (step S100), irradiating an optical signal onto the first and second mark patterns (step S110), obtaining coordinates of the second mark pattern by detecting a signal from the second mark patterns (step S120), and calculating an alignment deviation of the first and second mark patterns by comparing the coordinates of the second mark pattern with reference coordinates (step S130). In certain embodiments, the method may further include determining whether the alignment deviations of the first and second mark patterns are within acceptable variation or not (e.g., an error).

Figure 3A:
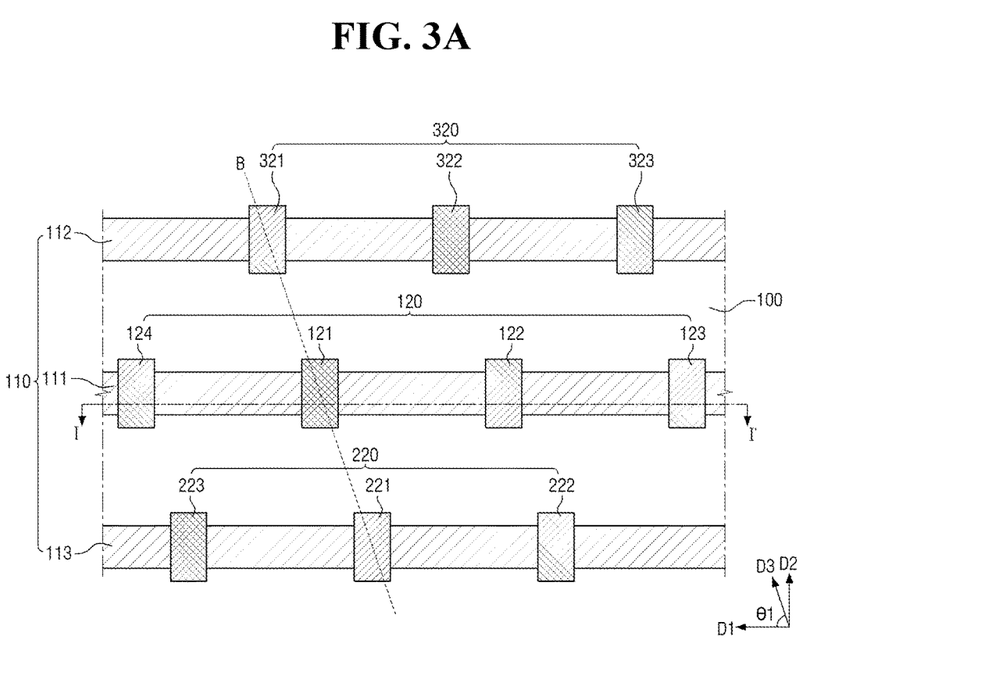
FIG. 3A is a top view of wafer alignment marks according to an exemplary embodiment of the present disclosure.
Figure 3B:
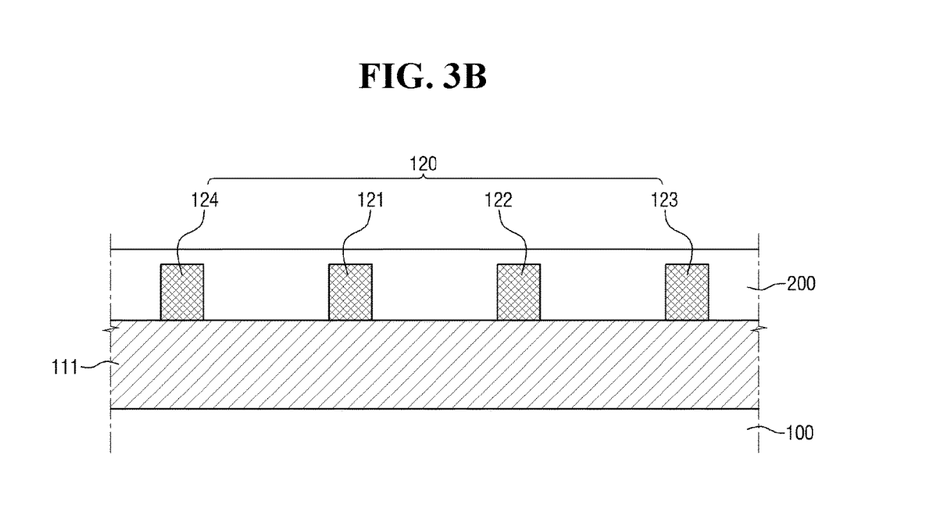
FIG. 3B is a cross-sectional view taken along line I-I' of FIG. 3A.

FIG. 3A is a top view of wafer alignment marks according to an exemplary embodiment of the present disclosure. FIG. 3B is a cross-sectional view taken along line I-I' of FIG. 3A.

Referring to FIGS. 2 to 3B, first mark patterns and second mark patterns on a wafer are provided (step S100).

The semiconductor wafer 10 may include a substrate 100. The substrate 100 may be a bulk silicon substrate or a SOI (silicon-on-insulator) substrate. Alternatively, the substrate 100 may be a silicon substrate or may be a substrate made of other materials, such as silicon germanium (SiGe), indium antimonide (InSb), lead-telluride (PbTe) compound, indium arsenide (InAs), indium phosphide (InP), gallium arsenide (GaAs) and gallium antimonide (GaSb), for example.

A first mark pattern 110 including a plurality of first line patterns 111, 112, and 113 may be formed on the substrate 100. The first mark pattern 110 may include an insulative material. For example, the first mark pattern 110 may include, but is not limited to, photoresists.

The first mark pattern 110 may extend in a first direction D1.

The first mark pattern 110 may include a first line pattern 111, a second line pattern 112 and a third line pattern 113 spaced apart from one another in a second direction D2.

The first line pattern 111 may be equally spaced apart from the second and third line patterns 112 and 113 in the second direction D2.

A second mark pattern including a plurality of rows of discrete patterns 120, 220, and 320 may be formed on the first mark pattern 110. Here, the second mark pattern comprises the plurality of rows of discrete patterns 120, 220 and 320. The plurality of rows of discrete patterns 120, 220, and 320 may overlap the plurality of first line patterns 111, 112, and 113. For example, the plurality of rows of discrete pattern 120, 220, and 320 may intersect the first mark pattern 110.

In certain embodiments, the second mark pattern including first line patterns 120, 220, and 320 may be formed directly adjacent to the first mark pattern 110 vertically. As used herein, the expression "directly adjacent to" may mean that there is no other element between the second mark pattern and the first mark pattern 110. For example, the second mark pattern may contact the first mark pattern 110 without any intervention layer between the second mark pattern and the first mark pattern 110.

Discrete patterns 121 to 124 may be spaced apart from one another in the first direction D1 on a first line pattern 111.

A row of discrete patterns 320 may be formed on a first line pattern 112. The row of discrete patterns 320 may overlap the first line pattern 112. For example, the row of discrete patterns 320 may be formed directly adjacent to the first line pattern 112. For example, the row of discrete patterns 320 may contact the first line pattern 112 without any intervening layer between the row of discrete patterns 320 and the first line pattern 112.

The row of discrete patterns 320 may have discrete patterns 321, 322, and 323, and the discrete patterns 321, 322, and 323 may be spaced apart from one another in the first direction D1. For example, the discrete patterns 321, 322, and 323 may be formed on the first line pattern 112.

The discrete patterns 121 through 323 of the second mark pattern formed on adjacent first line patterns 111, 112, and 113 may be offset from each other so that they do not align in the second direction D2, perpendicular to the first direction D1. In this example, the smallest pitch between a discrete pattern of the second mark pattern on a first line pattern 111 and another discrete pattern on a neighboring first line pattern 112 or 113 will be larger than the pitch between the first line patterns. One example of this spacing is shown in FIG. 3A, where the pitch between discrete patterns 121 and 321 is larger than the pitch between first line patterns 111 and 112. Discrete patterns 121 and 321 are disposed on a straight line B extending in a third direction D3. The straight line B extending in the third direction D3 extends in an oblique first angle θ 1 with respect to the first direction D1.

The first angle θ 1 may be associated with an optical signal having a particular diffraction angle in a later process of detecting optical signals.

The first mark pattern 110 and the second mark pattern 120, 220 and 320 shown in FIGS. 3A and 3B are only portions of the entire first mark pattern 110 and the second mark pattern. The first mark pattern 110 and the second mark pattern 120, 220 and 320 may be formed in a matrix throughout the scribe area 30 of the wafer 10. For example, the first mark pattern 110 and the second park pattern may be formed in a multiple area and/or a substantial area of the scribe area 30.

An insulation film 200 may be formed to cover the second mark pattern 120, 220 and 320.

In the wafer alignment mark patterns according to the exemplary embodiment shown in FIGS. 3A and 3B, the first mark pattern 110 and the second mark pattern 120, 220 and 320 are adjacent to the substrate 100. However, this is merely illustrative. For example, the first mark pattern 110 and the second mark pattern 120, 220 and 320 may be included in semiconductor layers adhesive to each other and may not be adjacent to the substrate 100. For example, the first mark pattern 110 and the second mark pattern 120, 220 and 320 may be formed on the substrate 100 with one or more intervening layers between the substrate 100 and the mark patterns. The intervening layers may be semiconductor layers, insulation layers, and/or conductor layers.

As exposure processes develop, exposure resolution becomes finer and semiconductor manufacturing processes become more complicated. Therefore, more semiconductor, conductor, and/or insulator layers are formed by exposure processes for producing a single product. Accordingly, it may be beneficial for mark patterns to be simultaneously determined whether a plurality of semiconductor layers is aligned with a wafer properly, for example, within a permissible limit or tolerance. In certain embodiments, in a photolithography process, a pattern may be aligned to two or more layer of patterns. In this case, it is beneficial to align certain patterns to two or more layer of patterns simultaneously to reduce process time of the alignment.

As the first mark pattern 110 is adjacent to the second mark pattern 120, 220 and 320 vertically, it may be beneficial to determine whether a semiconductor layer including the first mark pattern 110 is aligned properly with a semiconductor layer including the second mark pattern 120, 220 and 320.

For example, in the circuit area 40, a semiconductor layer including the first mark pattern 110 and a layer including a doped semiconductor may be at the same level. For example, the first mark pattern 110 and the layer including the doped semiconductor may be at the same vertical level. For example, the first mark pattern 110 and the layer including the doped semiconductor may be patterned from the same layer deposited and patterned in the same fabricating process. A semiconductor layer including the second mark pattern 120, 220 and 320, may be at the same level as a layer including a metal contact. For example, the second mark pattern 120, 220 and 320, may be at the same vertical level as the layer including the metal contact. For example, the second mark pattern 120, 220 and 320 may be formed from the same layer as the layer including the metal contact, and patterned in the same fabricating process.

Referring back to FIG. 2, an optical signal is irradiated onto the first mark pattern and the second mark pattern (step S110).

The irradiation may be performed by an exposure equipment. The exposure equipment may include, but is not limited to, an illumination system, a reticle stage, a projection optics, a wafer stage, a detection system, and so on. The method for measuring the wafer alignment with alignment marks according to the exemplary embodiments of the present disclosure may be performed by any exposure equipment commonly used in the related art.

Subsequently, signals from the second mark pattern are detected, such that coordinates of the second mark pattern are obtained (step S120).

Obtaining coordinates of the second mark pattern will be described in detail with reference to FIG. 4.

Figure 4:
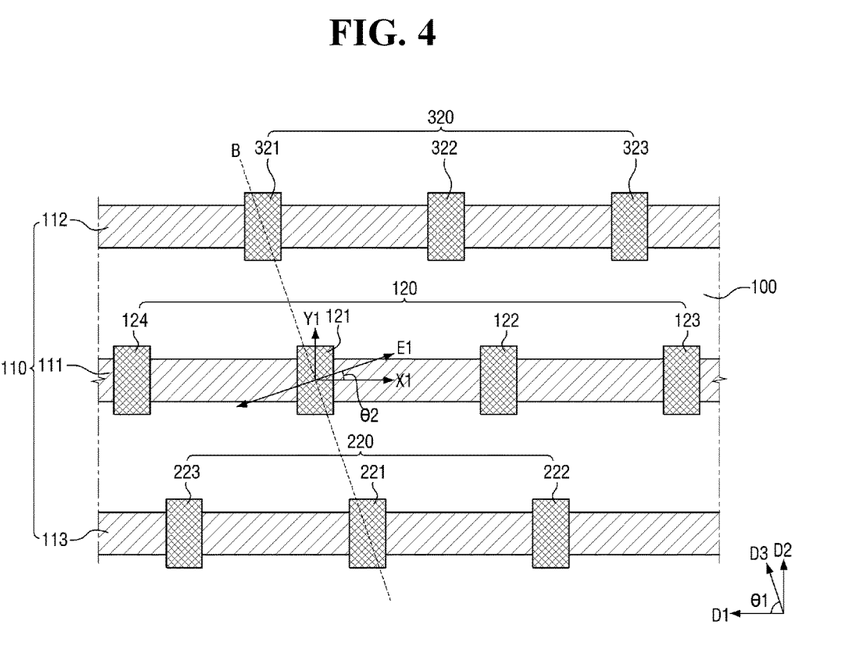
FIG. 4 is a view illustrating a way of obtaining coordinates of wafer alignment marks according to an exemplary embodiment of the present disclosure.

FIG. 4 is a view illustrating a way of obtaining coordinates of wafer alignment marks according to an exemplary embodiment of the present disclosure.

Referring to FIG. 4, when an optical signal is irradiated onto the first mark pattern 110 and the second mark pattern 120, 220 and 320, the optical signal may be reflected off the mark patterns at different diffraction angles. To perform the method for measuring the wafer alignment with alignment marks according to the exemplary embodiment of the present disclosure, an optical signal E1 reflected off the second mark pattern 120, 220 and 320 may be used.

The optical signal E1 may be diffracted in a direction perpendicular to the straight line B extending in the third direction D3. The optical signal E1 may make a second angle $\theta 2$ with the first direction D1 (with respect to a top down view). For example, with respect to a top down view, the optical signal E1 reflected off the second mark pattern 120, 220, and 320 may make the second angle $\theta 2$ (with respect to a top down view) with the extending direction of each of the first line patterns 111, 112 and 113 of the first mark pattern 110.

Accordingly, a detection system of an exposure equipment for performing the method according to the exemplary embodiment of the present disclosure may include a filter for separating the optical signal making the second angle $\theta 2$ (with respect to a top down view) with the first mark pattern 110.

A deviation of the second mark pattern 120, 220 and 320 from a target position may be obtained from the optical signal E1. The optical signal E1 detected by the detection system of the exposure equipment may be divided into a position vector X1 in the first direction D1 and a position vector Y1 in the second direction D2.

As the deviation of the second mark pattern 120, 220 and 320 from the target position is expressed in a synthesized value of the position vector X1 in the first direction D1 and the position vector Y1 in the second direction D2, it is possible to measure the deviation of the first mark pattern 110 from a target position in the second direction D2 and the deviation of the second mark pattern 120, 220 and 320 from a target position in the first direction D1 simultaneously.

For example, the first mark pattern 110 may extend in the first direction D1 and may have a deviation from a target position in the second direction D2, and may not have a deviation from a target position in the first direction D1. For example, the first mark pattern 110 and/or its relevant patterns (e.g., patterns contributing an actual device for which the first mark pattern 110 is used to measure alignment) may extend long enough in the first direction D1. In this case, a deviation of the first mark pattern 110 and/or its relevant patterns in the first direction D1 may not affect a pattern alignment. The second mark pattern 120, 220 and 320 overlaps the first mark pattern 110, and thus may have an error in the first direction D1. For example, patterns contributing an actual device for which the second mark pattern 120, 220 and 320 is used to measure alignment, may extend long enough in the second direction D2. In this case, a deviation of the second mark pattern 120, 220 and 320 and/or its relevant patterns in the second direction D2 may not affect a pattern alignment, and a deviation of the second mark pattern 120, 220 and 320 in the second direction D2 need not be measured.

For example, by obtaining the coordinates of the detected optical signal E1 from the second mark pattern 120, 220 and 320, a deviation of the first mark pattern 110 from a target position in the second direction D2 and a deviation of the second mark pattern 120, 220 and 320 in the first direction D1 may be separately measured.

In certain embodiments, the time taken to measure positions of wafer alignment marks included in two different layers may be equal to twice the time taken to measure a position of a wafer alignment mark included in a single layer.

For example, in order to obtain separated coordinates on a rectangular coordinate system from the wafer alignment marks included in two different layers, measurements of the wafer alignment marks may be performed twice.

In certain embodiments as shown in the above embodiment, the separated coordinates (in directions D1 and D2) on the rectangular coordinate system can be obtained by performing one measurement on the layer including the first mark pattern 110 and the layer including the second mark pattern 120, 220 and 320. As a result, the time taken to measure positions of the wafer alignment marks can be shortened, and accordingly the time for fabricating process of the semiconductor chips 20 may be reduced.

Figure 5:
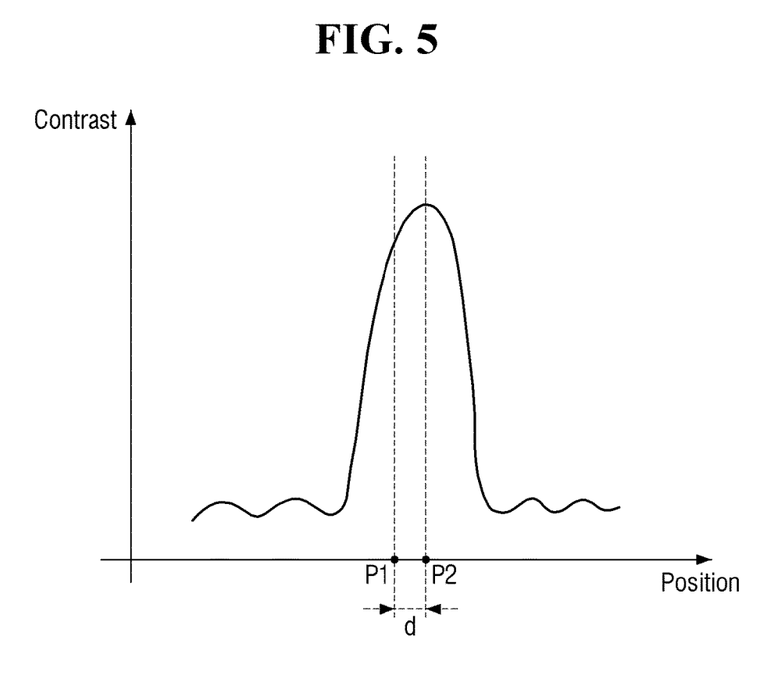
FIG. 5 is a graph showing measured coordinates of wafer alignment marks according to an exemplary embodiment of the present disclosure.

FIG. 5 is a graph showing measured coordinates of wafer alignment marks according to an exemplary embodiment of the present disclosure.

Referring to FIGS. 2 and 5, alignment deviations of the first and second mark patterns from a target position are calculated by comparing the previously measured coordinates of the second mark pattern with reference coordinates (step S130).

An example of the diffraction pattern of the optical signal E1 reflected off the second mark pattern 120, 220 and 320 is shown in FIG. 5. The diffraction pattern may show an interference of light caused by diffraction grating formed by line B and its parallel lines formed by the second mark pattern 120, 220, and 320. For example, even though the mark pattern 120, 220, and 320 are formed with discrete patterns 121-323, the patterns may act as a diffraction grating extending parallel to line B in a relatively macroscopic view, and light reflected from the second mark pattern 120, 220, and 320 may diffract and interfere with each other to form an interference pattern of light with which a position shift from a target position or the position of the pattern may be detected.

The optical signal E1 may be expressed in the curve exhibiting contrasts shown in the graph of FIG. 5. A coordinate P2 can be set based on the maximum measurement of the contrasts or intensity of light.

An alignment deviation d from a target position of the second mark pattern 120, 220 and 320 can be calculated based on a reference coordinate P1 and the coordinate P2 of the optical signal E1. As described above, a deviation from a target position (or from the reference coordinate P1) can be calculated from each of the coordinate X1 in the first direction D1 and the coordinate Y1 in the second direction D2 separated from the optical signal E1.

Figure 6:
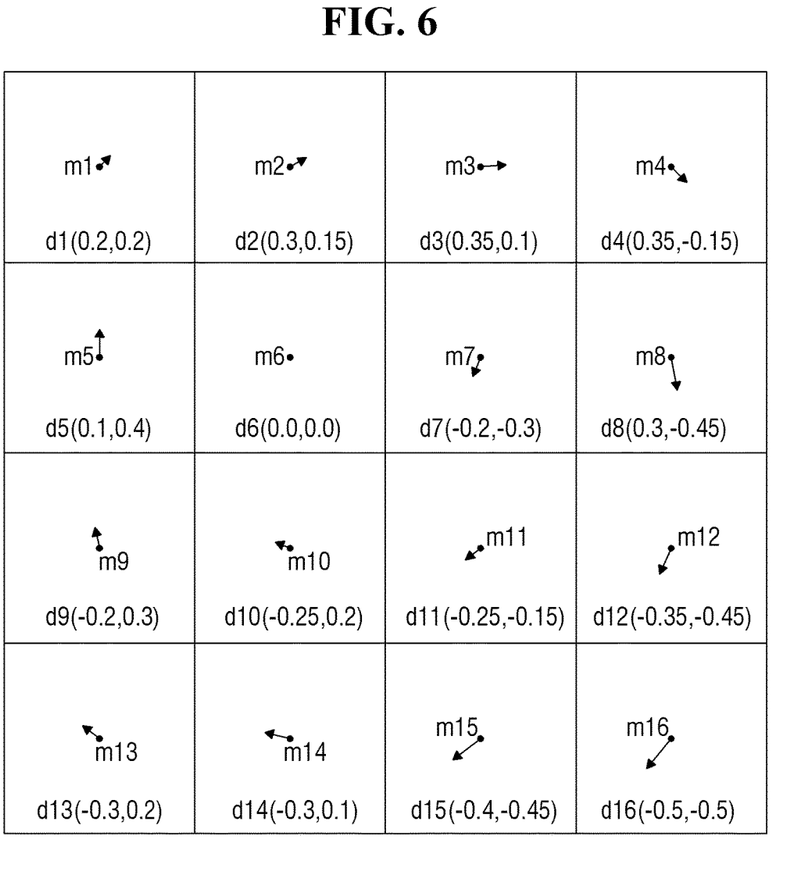
FIG. 6 is a diagram showing alignment deviations measured by using wafer alignment marks according to an exemplary embodiment of the present disclosure.

FIG. 6 is a diagram showing deviations from respective target positions measured by using wafer alignment marks according to an exemplary embodiment of the present disclosure.

Referring to FIG. 6, deviations dl to d16 were calculated from coordinates measured from the wafer alignment marks m1 to m16, respectively. The alignment marks m1 to m16 may be distributed throughout the wafer 10 or along a scribe area 30. Correction values for corresponding positions of the wafer alignment marks m1 to m16 by the exposure equipment may be set from the calculated deviations dl to d16, respectively. However, this is not limiting. It is to be understood that the average of the calculated deviation dl to d16 is obtained, and then the correction value of the exposure equipment may be set. For example, FIGS. 3A and 4 may show one set of alignment mark patterns, and FIG. 6 may show multiple sets of alignment mark patterns m1-m16. For example, wafer position may be adjusted before the wafer is exposed to a light pattern using alignment measurement result of multiple sets of alignment mark patterns through average or respective deviation results.

Figure 7:
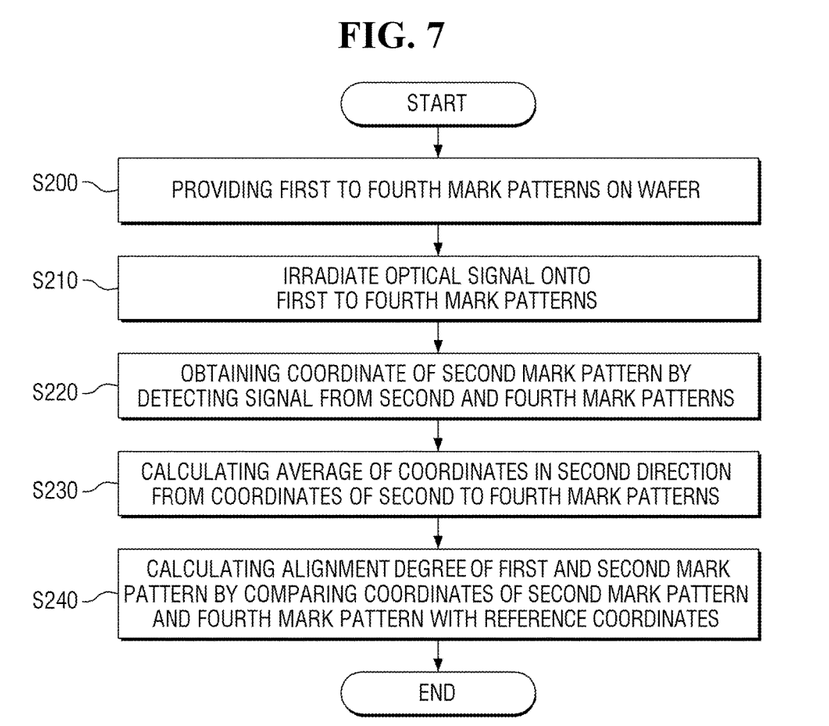
FIG. 7 is a flowchart illustrating a method of measuring alignment deviations of wafer alignment marks according to another embodiment of the present disclosure.

FIG. 7 is a flowchart illustrating a method for measuring deviations of wafer alignment marks from target positions according to another embodiment of the present disclosure.

Referring to FIG. 7, the method includes providing first to fourth mark patterns on a wafer (step S200), irradiating an optical signal onto the first to the fourth mark patterns (step S210), obtaining coordinates of the second to fourth mark patterns by detecting signals from the second to fourth mark patterns (step S220), and calculating an average of coordinates in a second direction from coordinates of the second to fourth mark patterns (step S230), and calculating alignment deviation of the first and second mark patterns by comparing the coordinates of the second mark pattern and the fourth mark patterns with reference coordinates (step S240). In the following descriptions, descriptions will be made focusing on differences from the above exemplary embodiment, and redundant descriptions will be omitted.

Figure 8:
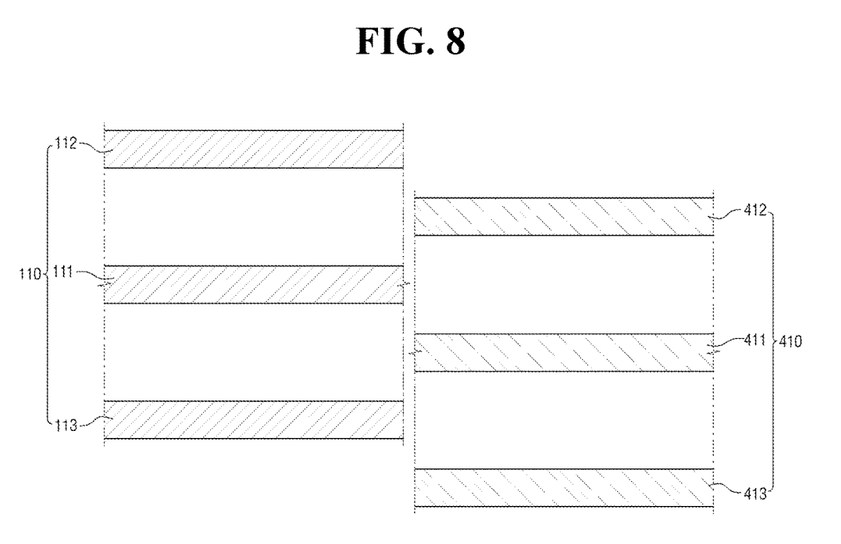
FIGS. 8 and 9 are views showing wafer alignment marks according to another exemplary embodiment of the present disclosure.
Figure 9:
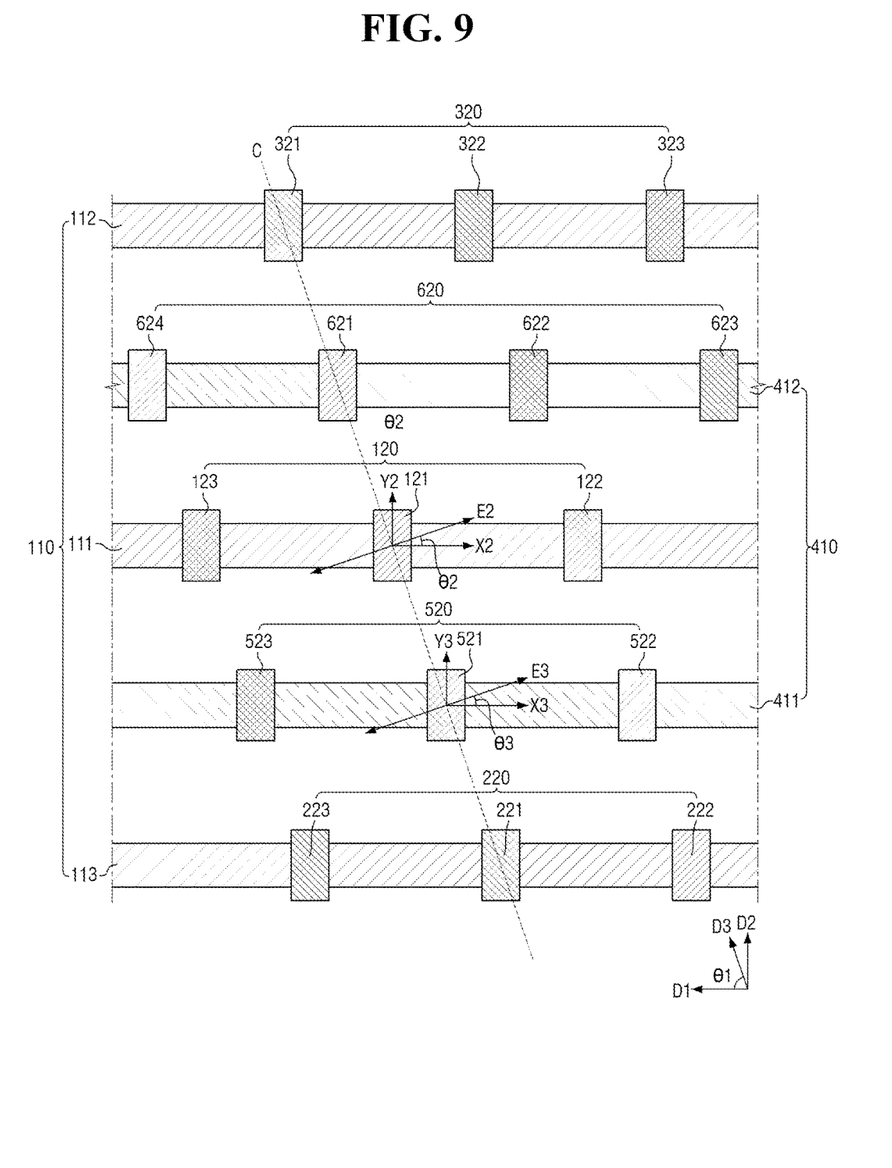

FIGS. 8 and 9 are views showing wafer alignment marks according to another exemplary embodiment of the present disclosure.

Referring to FIGS. 7 to 9, first to fourth mark patterns on a wafer are provided (step S200).

The third mark pattern 410 may be formed in a layer of the semiconductor device between the layer of the semiconductor device forming first mark pattern 110 and the layer of the semiconductor device forming the second mark pattern 120, 220 and 320.

For example, a first layer from which the first mark pattern 110 is formed, a second layer from which the third mark pattern 410 is formed, and a third layer from which the second mark pattern 120, 220 and 320 is formed may be sequentially formed in that order in manufacturing the semiconductor device.

Each third line patterns 411 and 412 of the third mark pattern 410 may be disposed between the respective two first line patterns of the first mark pattern 110 alternately. The first mark pattern 110 may not vertically overlap the third mark pattern 410.

A row of discrete patterns 520 of fourth mask pattern 520 and 620 may be formed on the third line pattern 411 of the third mark pattern 410 such that they overlap the third line pattern 411. The discrete pattern 121 of the second mask pattern and a discrete pattern 521 of the fourth mask pattern 520 and 620 may be disposed on a straight line C extending in the third direction D3 that makes a first angle θ1 with the first direction D1. For example, the discrete patterns 121 521 may make the first angle θ1 with respect to the extending direction of the first and third mark patterns 110 and 410.

The average of coordinates in the second direction D2 is calculated from the coordinates of the second mark pattern 120, 220 and 320 and the fourth mark pattern 520 and 620 (step S230).

The row of discrete patterns 120 of the second mark pattern and the row of discrete patterns 520 of the fourth mark pattern may have different deviations in the second direction D2. Similarly with the above-described embodiment, the coordinate of the first mark pattern 110 in the second direction D2 may be obtained from an optical signal E2 that is reflected off the second mark pattern 120, 220 and 320 and is then diffracted to make a second angle θ2 (with respect to a top down view) with respect to the first direction D1.

Likewise, the coordinate of the third mark pattern 410 in the second direction D2 may be obtained from an optical signal E3 that is reflected off the fourth mark pattern 520 and 620.

Subsequently, the average of coordinates in the second direction D2 is calculated from the coordinates of the second mark patterns and the fourth mark patterns (step S230).

The layer including the first mark pattern 110 and the layer including the third mark pattern 410 may have different coordinates in the second direction D2. To obtain overall coordinates of the layers, the average of the coordinates of the layer including the second mark pattern 120, 220 and 320, and the coordinates of the layer including the fourth mark patterns 520 and 620 are calculated.

Finally, the averaged coordinates of the second mark pattern 120, 220 and 320, and the fourth mark pattern 520 and 620 are compared with reference coordinates, and alignment errors of the second mark pattern and the fourth mark pattern are calculated (step S240).

In certain embodiments, the second mark pattern and the fourth mark pattern may be formed in different layers. For example, the second mark pattern and the fourth mark pattern may be formed by different photolithography process from each other. In certain embodiments, the second mark pattern and the fourth mark pattern may be formed with a same layer by a same photolithography process.

Alignment patterns, alignment measuring methods using the alignment patterns are disclosed above. The alignment measuring methods may be used to fabricate semiconductor devices. For example, photomasks may be aligned with respect to wafers to manufacture semiconductor devices. In this case, alignment patterns may be used to determine a position of the wafers, and the wafers may be adjusted to be aligned with respect to a photomask. According to certain embodiments, after a fabrication of a wafer by a photolithography process, the alignment patterns may be used to determine whether fabricated patterns are properly aligned with respect to other patterns. In this case, the alignment patterns and methods of measuring alignment disclosed above may be used to determine there is an alignment error in the fabricated patterns.

The exemplary embodiments of the present disclosure have been described with reference to the accompanying drawings. However, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A method of measuring wafer alignment, the method comprising:
   providing a first mark pattern including a first line pattern and a second line pattern, each of the first and second line patterns extending along a corresponding line that extends in a first direction on a wafer;
   providing a second mark pattern including a plurality of first discrete patterns and a plurality of second discrete patterns, each of the plurality of first discrete patterns overlapping the first line pattern in a top down view, the plurality of first discrete patterns spaced apart from each other in the first direction, each of the plurality of second discrete patterns overlapping the second line pattern in the top down view, the plurality of second discrete patterns spaced apart from each other in the first direction;
   irradiating an optical signal onto the first mark pattern and the second mark pattern;
   obtaining coordinates of the second mark pattern by detecting signals from the second mark pattern; and
   calculating an alignment deviation of the first and second mark patterns from a reference position by comparing coordinates of the second mark pattern with coordinates of the reference position,
   wherein the first line pattern is spaced apart from the second line pattern in a second direction perpendicular to the first direction,
   wherein one of the plurality of first discrete patterns and a closest one of the plurality of second discrete patterns to the one of the plurality of first discrete patterns are disposed on an oblique line that makes a first oblique angle with respect to the first direction.

2. The method of claim 1, wherein the coordinates of the second mark pattern comprise a coordinate in a first direction and a coordinate in a second direction perpendicular to the first direction, and the alignment deviation of the first mark pattern is calculated from the coordinate in the second direction of the second mark pattern.

3. A method of measuring wafer alignment, the method comprising:
   providing a first mark pattern on a wafer, the first mark pattern comprising a plurality of first line patterns, the first line patterns extending in a first direction and spaced apart from one another;
   providing a second mark pattern on the first mark pattern, the second mark pattern comprising a plurality of rows of discrete patterns, the discrete patterns arranged in a second direction that is an oblique direction with respect to the first direction;
   irradiating an optical signal onto the first mark pattern and the second mark pattern;
   obtaining coordinates of the second mark pattern by detecting signals from the second mark pattern; and
   calculating a deviation of the first mark pattern from a reference position in a third direction perpendicular to the first line patterns and a deviation of the second mark pattern from the reference position in the first direction using the coordinates of the second mark pattern.

4. The method of claim 3, wherein the second mark pattern is disposed such that the second mark pattern overlaps the first mark pattern.

5. The method of claim 3, wherein a signal detecting from the second mark pattern comprises an optical signal that is diffracted in a fourth direction oblique to the second direction.

6. The method of claim 5, wherein the coordinates of the second mark pattern correspond to a point where the optical signal diffracted in the fourth direction has a maximum contrast.

* * * * *